United States Patent
Kuo et al.

(10) Patent No.: US 6,429,735 B1
(45) Date of Patent: Aug. 6, 2002

(54) HIGH SPEED OUTPUT BUFFER

(75) Inventors: James R. Kuo, Cupertino; Tuong Hai Hoang, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/942,988

(22) Filed: Aug. 29, 2001

(51) Int. Cl.[7] .................................................. G06G 7/12
(52) U.S. Cl. .......................... 327/563; 327/53; 327/112; 330/252; 330/264; 330/288; 330/311
(58) Field of Search ................................. 327/560–562, 327/563, 51–53, 55, 65, 66, 89, 108–112; 330/252–255, 257, 258, 261, 262–264, 269, 277, 288, 310, 311; 365/190, 207, 208; 307/412; 326/26–27, 82, 83, 88, 92

(56) References Cited

U.S. PATENT DOCUMENTS

| | | | |
|---|---|---|---|
| 4,845,672 A | * 7/1989 | Watanabe et al. | ............ 365/190 |
| 5,682,119 A | * 10/1997 | Soda | ..................... 330/252 |
| 6,242,980 B1 | * 6/2001 | Tsukagoshi et al. | ........ 330/253 |
| 6,285,256 B1 | * 9/2001 | Wong | ......................... 330/255 |

* cited by examiner

*Primary Examiner*—Timothy P. Callahan
*Assistant Examiner*—Minh Nguyen
(74) *Attorney, Agent, or Firm*—Brett A. Hertzberg; Merchant & Gould P.C.

(57) ABSTRACT

An apparatus for an improved output buffer includes a symmetrical pre-gain stage and a gain stage. The pre-gain stage includes a pair of matched differential amplifiers that are arranged to provide a differential intermediary signal. The gain stage is arranged to receive the differential intermediary signal and provide a single-ended output signal. The pre-gain stage differential amplifiers include transistors that are arranged as differential pairs, where each of differential pair transistors is minimally sized to provide very low capacitive loading. The pre-gain stage differential amplifiers are matched such that symmetrical amplification is obtained from the differential intermediary signal. The pre-gain stage arrangement provides for a differential intermediary signal such that common-mode noise rejection and power supply noise rejection are enhanced. The improved output buffer operates at high frequencies that are well into the gigahertz operating range, while maintaining reasonably high-gain and very low distortion in the signal symmetry.

15 Claims, 6 Drawing Sheets

HIGH SPEED OUTPUT BUFFER

FIELD OF THE INVENTION

The present invention relates generally to high-speed output buffers. More particularly, the present invention relates to an apparatus for an output buffer that has low capacitive loading and high-speed operation with improved symmetry.

BACKGROUND OF THE INVENTION

Figure 6:
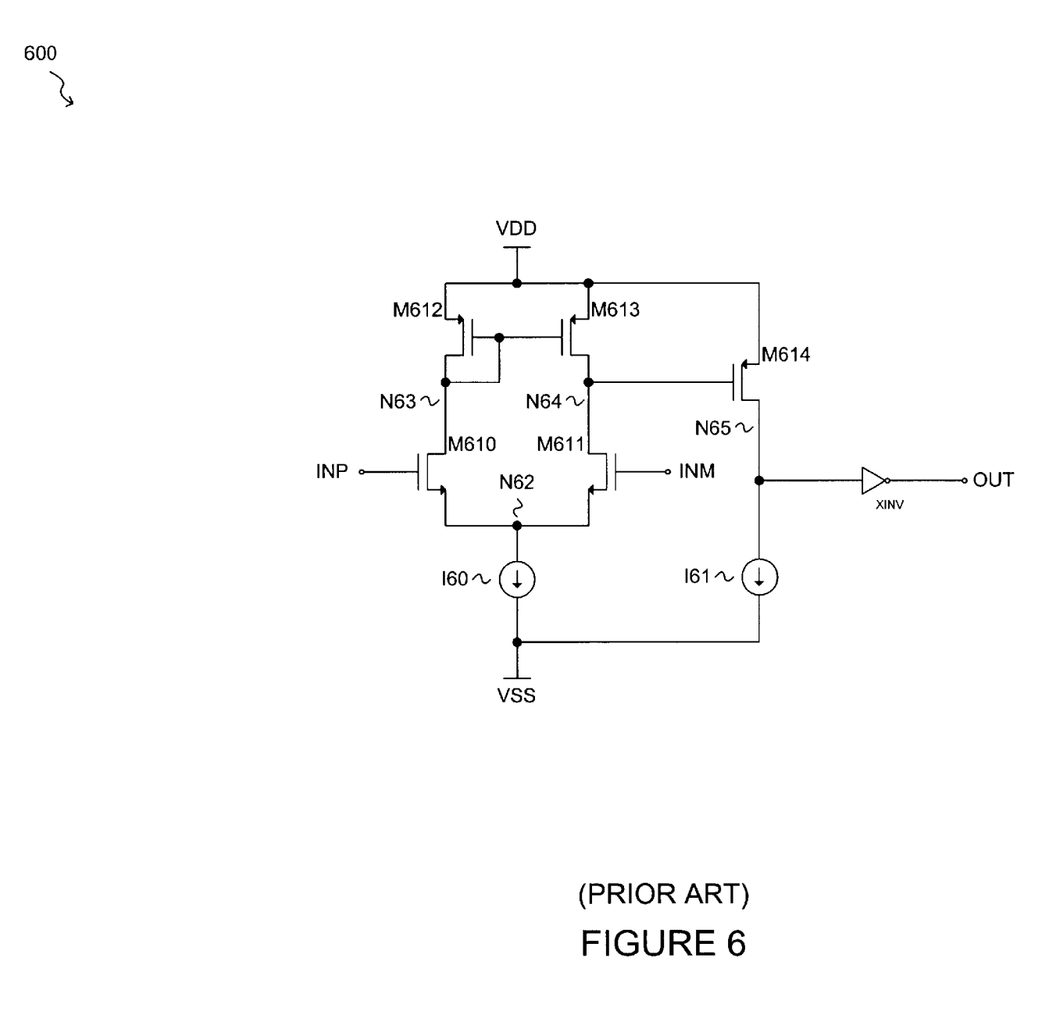
FIG. 6 is a schematic diagram of a conventional differential amplifier circuit.

Differential amplifiers are often employed to isolate a signal path from one or more output terminals in a circuit. A conventional differential amplifier (600) is illustrated in FIG. 6. As shown in the figure, the conventional differential amplifier (600) includes two NMOS transistors (M610–M611), three PMOS transistors (M612–M614), two current sources (I60, I61), and an inverter (XINV).

Transistor M610 includes a gate that is connected to a non-inverting input terminal (INP), a drain that is connected to node N63, and a source that is connected to node N62. Transistor M611 includes a gate that is connected to an inverting input terminal (INM), a drain that is connected to node N64, and a source that is connected to node N62. Transistor M612 includes a gate and drain that are connected to node N63, and a source that is connected to a high power supply terminal (VDD). Transistor M613 includes a gate that is connected to node N63, a drain that is connected to node N64, and a source that is connected to VDD. Transistor M614 includes a gate that is connected to node N64, a drain that is connected to node N65, and a source that is connected to VDD. Current source I60 is connected between nodes N62 and VSS. Current source I61 is connected between nodes N65 and VSS. Inverter XINV has an input that is connected to node N65, and an output that is connected to an output terminal (OUT).

In operation, a differential input voltage is applied across the non-inverting and inverting input terminals (INP, INM). Transistors M610 and M611 are a differential pair that is arranged to provide a first gain stage for amplifying the differential input voltage. Node N64 is a high gain node that is used as an output of the first gain stage. Transistor M614 and I61 are arranged to operate as a second gain stage, further amplifying the signal from node N64. Inverter XINV operates as a third gain stage. Inverter XINV provides a single-ended output signal at the output terminal (OUT).

SUMMARY OF THE INVENTION

The present invention is directed to high-speed output buffers. More particularly, the present invention relates to an apparatus and for an output buffer that has low capacitive loading and high-speed operation with improved symmetry.

Briefly described below is an apparatus for an improved output buffer includes a symmetrical pre-gain stage and a gain stage. The pre-gain stage includes a pair of matched differential amplifiers that are arranged to provide a differential intermediary signal. The gain stage is arranged to receive the differential intermediary signal and provide a single-ended output signal. The pre-gain stage differential amplifiers include transistors that are arranged as differential pairs, where each of differential pair transistors is minimally sized to provide very low capacitive loading. The pre-gain stage differential amplifiers are matched such that symmetrical amplification is obtained from the differential intermediary signal. The pre-gain stage arrangement provides for a differential intermediary signal such that common-mode noise rejection and power supply noise rejection are enhanced. The improved output buffer operates at high frequencies that are well into the gigahertz operating range, while maintaining reasonably high-gain and very low distortion in the signal symmetry.

An apparatus that provides a buffered output signal in response to a differential input signal that is provided by an electronic circuit is also described below. The apparatus includes a pre-gain stage amplifier that is arranged to provide a differential intermediary signal in response to the differential input signal. The pre-gain stage amplifier includes a first differential amplifier that provides a first half of a gain associated with the pre-gain amplifier and a second differential amplifier that provides a second half of the gain of the pre-gain stage amplifier. A gain stage amplifier provides the buffered output signal in response to the differential intermediary signal. The input impedance of the pre-gain stage amplifier has a low input capacitance such that the performance of the electronic circuit is unaffected by the apparatus.

In one example, an apparatus is described below that includes a first and second differential amplifier, and a transconductance amplifier. The first amplifier includes a first non-inverting input, a first inverting input, and a first output. A differential input signal is coupled across the first non-inverting input and the first inverting input. The second differential amplifier includes a second inverting input that is coupled to the first non-inverting input, a second non-inverting input that is coupled to the first inverting input, and a second output. The transconductance amplifier includes a third non-inverting input that is coupled to the first output, and a third inverting input that is coupled to the second output. The first and second differential amplifiers provide an intermediary differential signal across the first output and the second output. The transconductance amplifier provides the buffered output signal at the third output in response to the intermediary differential signal.

In another example, an apparatus is described below that includes a first means for amplifying and a second means for amplifying. The first means for amplifying is arranged to provide a differential intermediary signal by differentially amplifying the differential input signal. The differential intermediary signal rejects common-mode signals. The first means for amplifying includes a means for receiving that is arranged to receive the differential input signal while minimizing capacitive loading on the electronic circuit. The second means for amplifying is arranged to provide the buffered output signal by amplifying the differential intermediary signal.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" and "on".

The present invention generally relates to an improved output buffer. The improved output buffer includes a pre-gain stage and a gain stage. The pre-gain stage is arranged to provide very low capacitive loading such that the connection of the output buffer to another electronic circuit does not adversely affect the performance of the other electronic circuit. In one example, a voltage-controlled oscillator (VCO) provides a differential signal to an input of the pre-gain stage in the improved output buffer. In another example, the output of a differential delay-line is connected to the improved output buffer. The improved output buffer may be employed to buffer signal from any electronic circuit that provides a differential output signal.

The operating environment for the improved output buffer will be described below with reference to FIG. 1.

Operating Environment

Figure 1:
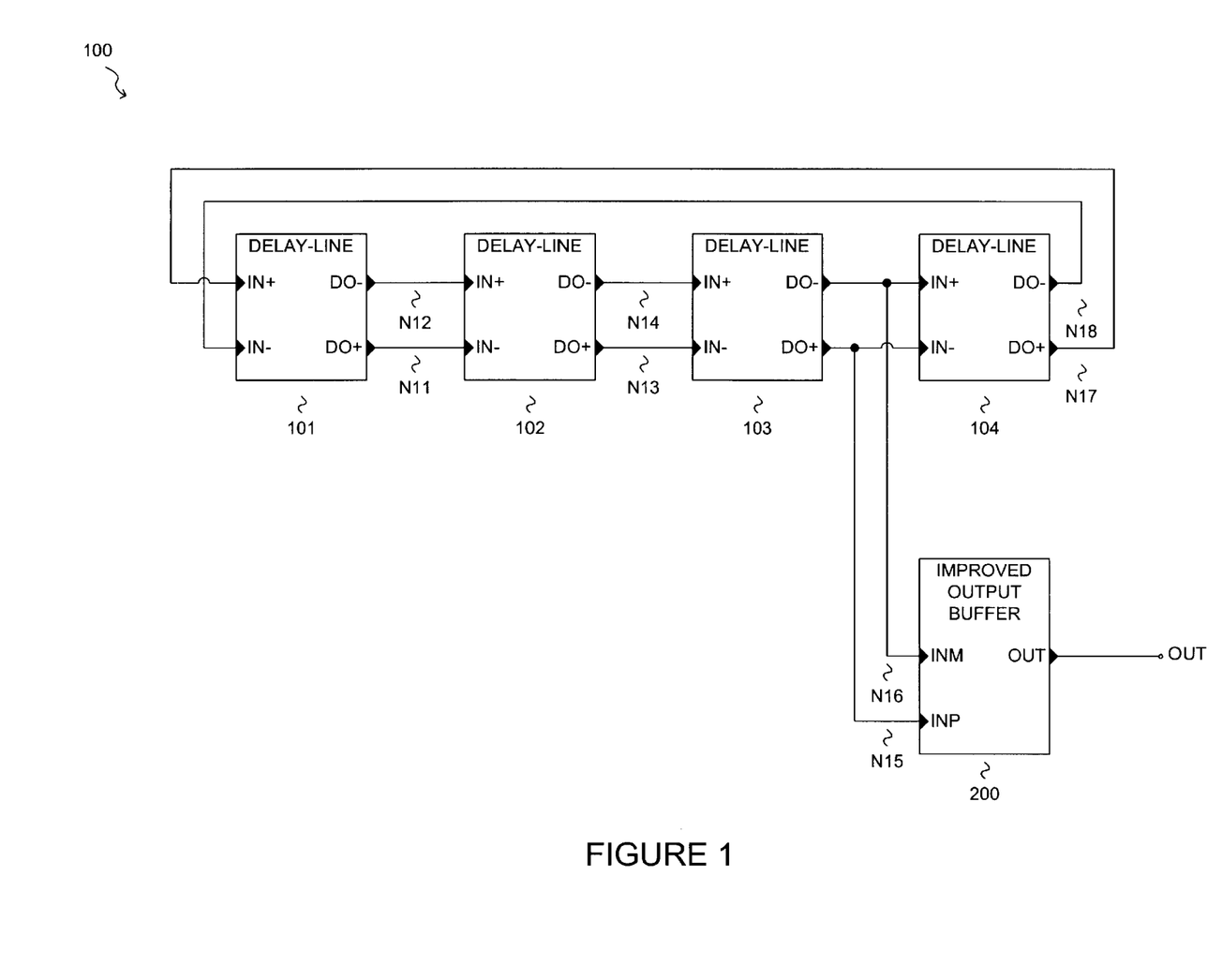
FIG. 1 illustrates an operating environment.

FIG. 1 illustrates an exemplary operating environment (100) for an improved output buffer (200) that is in accordance with the present invention. Four delay-line circuits (101, 102, 103, 104) are arranged to operate with the improved output buffer (200) as shown in the figure.

Delay-line 101 has a differential input (IN+, IN−) that is coupled to nodes N17 and N18 respectively, and a differential output (DO+, DO−) that is coupled to nodes N11 and N12 respectively. Delay-line 102 has a differential input (IN+, IN−) that is coupled to nodes N12 and N11 respectively, and a differential output (DO+, DO−) that is coupled to nodes N13 and N14 respectively. Delay-line 103 has a differential input (IN+, IN−) that is coupled to nodes N17 and N18 respectively, and a differential output (DO+, DO−) that is coupled to nodes N15 and N16 respectively. Delay-line 104 has a differential input (IN+, IN−) that is coupled to nodes N16 and N15 respectively, and a differential output (DO+, DO−) that is coupled to nodes N17 and N18 respectively. The improved output buffer (200) has a differential input (INP, INM) that is coupled to nodes N15 and N16 respectively.

In operation, the delay-line circuits (101-104) are arranged to form a ring-type oscillator. For the example illustrated in FIG. 1, the four delay-line circuits are arranged such that the first three delay line circuits (101–103) provide three cascaded inversions between their inputs and outputs. The fourth delay line circuit (104) does not provide any inversion. Each of the delay-line circuits provides a differential output signal (DO+, DO−) that changes in response to changes in the differential input signal (IN+, IN−). Each of the differential output signals does not change instantaneously, and instead only changes after a predetermined delay with respect to changes in the corresponding input signal.

The improved output buffer circuit (200) is coupled to the differential output (DO+, DO−) of the third delay-line circuit (103). The present invention provides for an improved output buffer (200) that has a very high input impedance such that it does not load down the delay-line circuits. Also, the improved output buffer (200) has very low input capacitance (e.g., on the order of 100fF) such that it does not change any high frequency characteristics of the ring oscillator. In one example, the improved output buffer (200) provides gains of over 60 dB at 100 MHz, and over 30 dB of gain at 1 GHz.

Although the above discussion described the use of the improved output buffer circuit with a ring-oscillator, the use of the improved output buffer is not limited to such use. In light of the present disclosure, one of ordinary skill in the art will appreciate that the present invention will have utility in any system that requires a high bandwidth buffer that has low reduced capacitive loading.

Improved Output Buffer Overview

Figure 2:
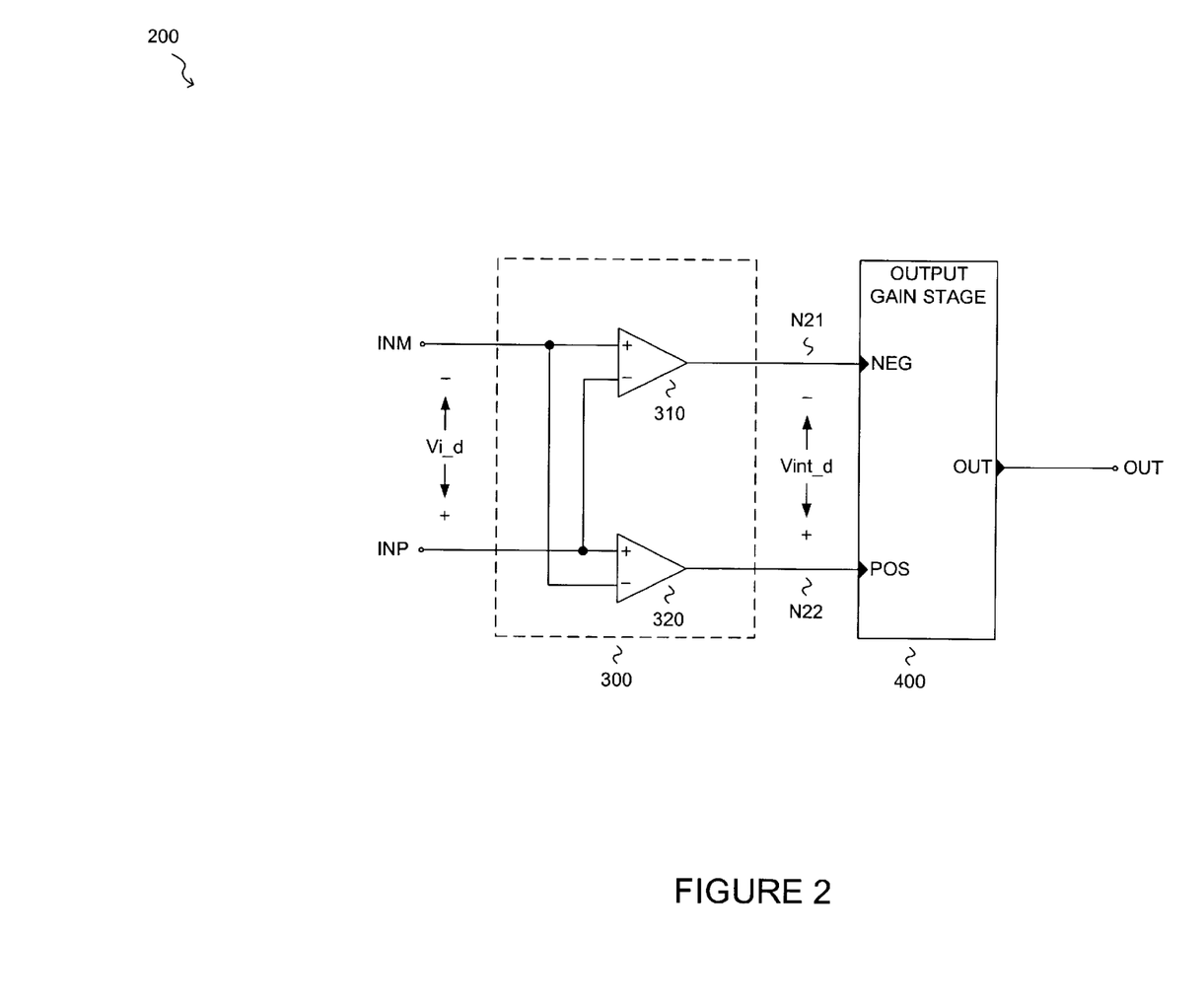
FIG. 2 is a block diagram illustrating an exemplary output buffer.

FIG. 2 illustrates an overview of an illustrative improved output buffer circuit (200). The improved output buffer circuit (200) includes a pre-gain stage (300) and an output gain stage (400).

The pre-gain stage (300) includes input terminals INP and INM that are arranged to receive a differential input signal. The pre-gain stage (300) provides a pre-gain differential output signal to nodes N21 and N22 in response to the differential input signal. The output gain-stage includes an input terminal (NEG) that is coupled to node N21, another input terminal (POS) that is coupled to node N22, and provides an output signal (OUT) through an output terminal.

The pre-gain stage (300) includes a symmetrical set of differential amplifiers (310, 320). Differential amplifier 310 includes a non-inverting input terminal that is coupled to INM, an inverting input terminal that is coupled to INP, and provides a first output signal at node N21. Differential amplifier 320 includes a non-inverting input terminal that is coupled to INP, an inverting input terminal that is coupled to INM, and provides a second output signal at node N22. The first and second output signals each provide half of the pre-gain differential output signal.

Exemplary Pre-gain Stage Circuit

Figure 3:
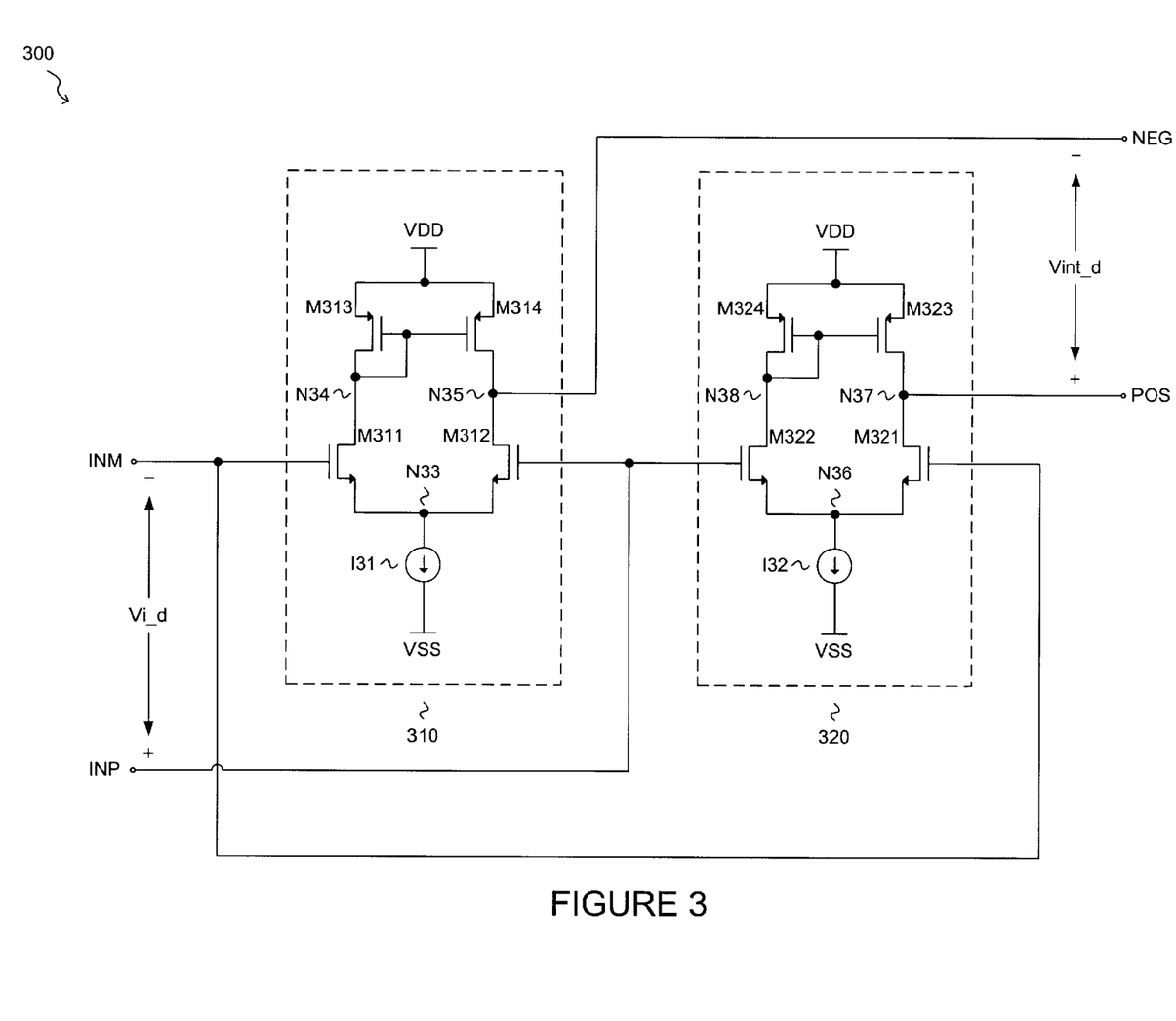
FIG. 3 is a schematic diagram illustrating an exemplary pre-gain stage.

An exemplary pre-gain stage circuit (300) is illustrated in FIG. 3. The pre-gain stage circuit (300) includes two differential amplifiers (310, 320) that are arranged in accordance with the present invention. Differential amplifier 310 includes two NMOS transistors (M311, M312), two PMOS transistors (M313, M314), and a current source (131). Differential amplifier 320 includes two NMOS transistors (M321, M322), two PMOS transistors (M323, M324), and a current source (132).

Transistor M311 includes a gate that is coupled to INM, a drain that is coupled to node N34, and a source that is coupled to node N33. Transistor M312 includes a gate that is coupled to INP, a drain that is coupled to node N35, and a source that is coupled to node N33. Transistor M313 includes a gate and drain that are coupled to node N34, and a source that is coupled to VDD (the high power supply terminal). Transistor M314 includes a gate that is coupled to node N34, a drain that is coupled to node N35, and a source that is coupled to VDD. Current source 131 is coupled between N33 and VSS (the low power supply terminal). An output terminal (POS) is coupled to node N35.

Transistor M321 includes a gate that is coupled to INM, a drain that is coupled to node N37, and a source that is coupled to node N36. Transistor M322 includes a gate that is coupled to INP, a drain that is coupled to node N38, and a source that is coupled to node N36. Transistor M323 includes a gate that is coupled to node N38, a drain that is coupled to node N37, and a source that is coupled to VDD. Transistor M324 includes a gate and drain that are coupled to node N38, and a source that is coupled to VDD. Current source 132 is coupled between N36 and VSS. An output terminal (NEG) is coupled to node N37.

Transistors M311–M314 and current source 131 are arranged to operate as a first differential amplifier (310). In the first differential amplifier (310), transistors M311 and M312 are arranged as a differential pair, where transistors M313 and M314 are active load devices. Similarly, transistors M321–M324 and current source 132 are arranged to operate as a second differential amplifier (320). In the second differential amplifier (320), transistors M322 and M321 are arranged as a differential pair, where transistors M323 and M324 are active load devices.

In operation, pre-gain stage (300) provides a differential output signal across the POS and NEG terminals in response to a differential input signal (Vi_d) that is applied across the INP and INM terminals. The differential output signal is a differential signal that will be applied to a subsequent gain stage (not shown). As such, the differential output signal operates as a differential intermediary signal (Vint_d) in the improved output buffer (see FIG. 2). Differential amplifier (310) provides amplification for the negative half (NEG) of the differential intermediary signal (Vin_d), while differential amplifier 320 provides amplification for the positive half (POS) of the differential intermediary signal (Vint_d).

In other conventional amplifiers (i.e., see FIG. 6), the input transistors (i.e. M610, M611) are increased in size to provide additional gain. The gate capacitance of these input transistors increases as the transistor sizes increase. When the conventional amplifier is connected to a differential signal source (e.g., a differential oscillator) are very high capacitive load is seen from differential signal source due to the input transistors increased capacitance. The high capacitive loading will cause adverse effects on high frequency signals such as from a high-speed oscillator. In contrast, the present invention provides for a low capacitive loading (on the order of 40fF).

Also, the conventional amplifier illustrated in FIG. 6 has a dominant pole that is caused by the capacitance inherent in the gate of transistor M614. Typically, increasing the size of transistor M614 increases the gain in conventional differential amplifier 600. However, as transistor M614 increases in size the capacitance in transistor M614 also increases. Since the capacitance in transistor M614 couples a signal from node N64 to node N65 via the miller effect, an increase in the capacitance reduces the bandwidth of the differential amplifier (600). Thus, the gain and bandwidth of the conventional amplifier are inversely related to one another. As will be discussed later with respect to FIG. 5, the present invention provides for increased gain (by at least 2x) for a similar bandwidth when compared to the conventional differential amplifier (600).

In the present invention, the sizes of the differential pair transistors (M311, M312, M322, M322) are small to minimize capacitive loading on the inputs INM and INP. As described previously with respect to FIG. 1, capacitive loading from the pre-gain stage (300) may result in changes in the oscillation frequency. In one example, the width and length of the transistors are on the order of 1 um and 0.35 um respectively. By minimizing the gate area in these devices, capacitive loading is also minimized.

The first and second differential amplifiers (310, 320) are arranged to operate as symmetrical input stages. Since the INM and INP inputs are coupled to matched amplifier input stages, each signal sees the same input impedance. In an oscillator circuit such as that illustrated in FIG. 1, the symmetrical input impedance of amplifiers 310 and 320 provides for improved symmetry in the output waveforms provided by the POS and NEG terminals. Thus, the symmetrical design is arranged such that the overall output signal will remain very close to a 50% duty cycle for a 50% duty cycle input signal. In one embodiment of the invention, a 50% duty cycle input signal at up to 1 GHz frequency will provide a 48% duty cycle output signal.

The symmetrical design in the present invention rejects common-mode noise and has good power supply rejection. Since the output of the pre-gain stage (300) is fully differential, noise is produced equally on the POS and NEG outputs. The resulting common-mode noise is rejected, as is power supply noise. In contrast, the conventional differential amplifier has poor common mode rejection and poor power supply rejection because the amplification is single-ended amplification. For example, a signal or noise in the VDD supply line will directly couple through the source of transistor M614 to its gate, resulting in a change in the output.

Exemplary Gain Stage Circuit

Figure 4:
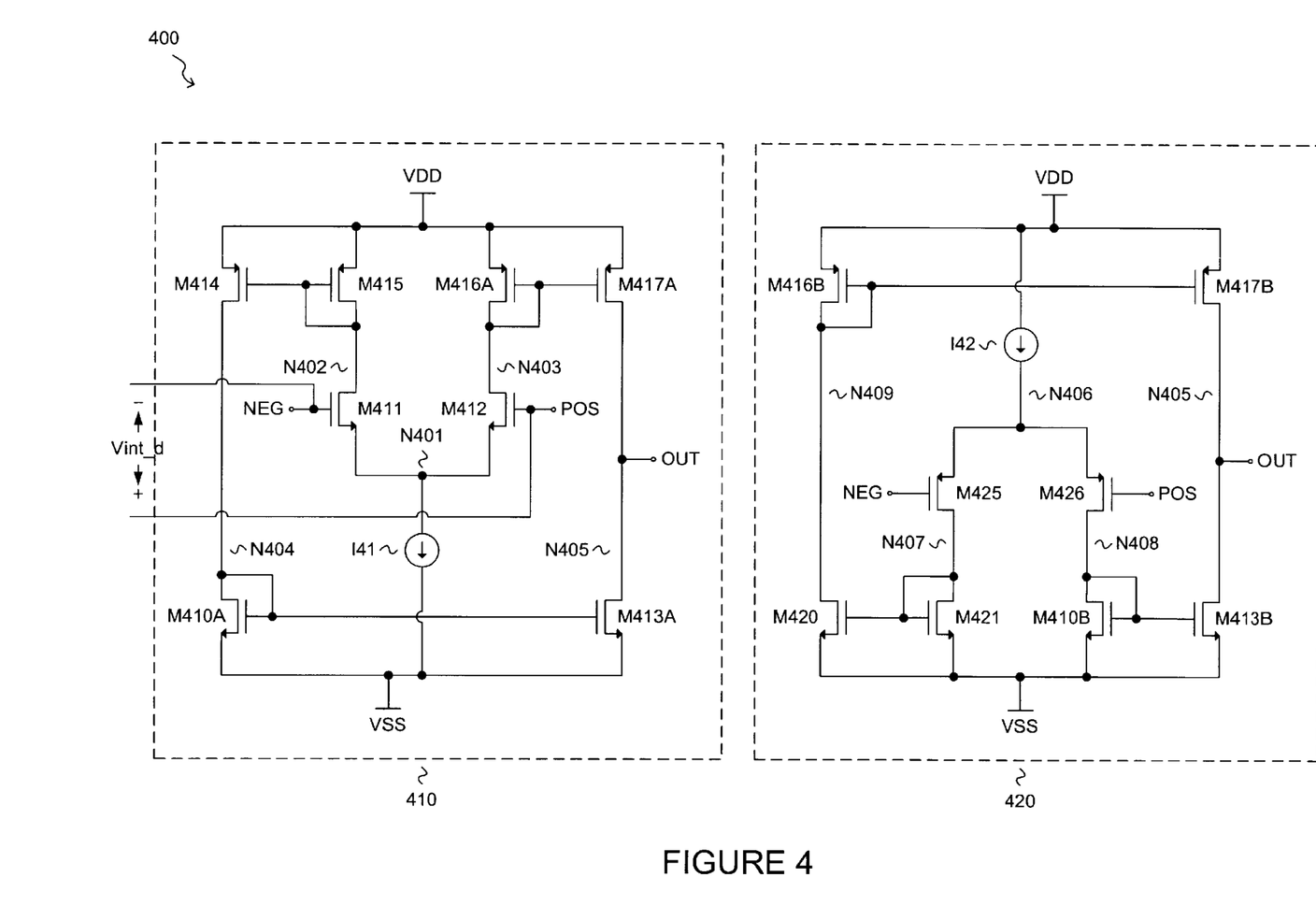
FIG. 4 is a schematic diagram illustrating an exemplary gain-stage.

An exemplary gain stage circuit (400) is illustrated in FIG. 4. The gain stage circuit (400) includes two transconductance amplifiers (410, 420) that are arranged in accordance with the present invention. Transconductance amplifier 410 includes four NMOS transistors (M410A, M411, M412, M413A), four PMOS transistors (M414, M415, M416A, M417A), and a current source (141). Transconductance amplifier 420 includes four NMOS transistors (M420, M421, M410B, M413B), four PMOS transistors (M425, M426, M416B, M417B), and a current source (142).

Transistor M411 includes a gate that is coupled to NEG, a drain that is coupled to node N402, and a source that is coupled to node N401. Transistor M412 includes a gate that is coupled to POS, a drain that is coupled to node N403, and a source that is coupled to node N401. Transistor M415 includes a gate and drain that are coupled to node N402, and a source that is coupled to VDD (the high power supply terminal). Transistor M416A includes a gate and drain that are coupled to node N403, and a source that is coupled to VDD. Transistor M414 has a gate that is coupled to node N402, a drain that is coupled to node N404, and a source that is coupled to VDD. Transistor M410A includes a gate and drain that are coupled to node N404 and a source that is coupled to VSS (the low power supply terminal). Transistor M413A has a gate that is coupled to node N404, a drain that is coupled to N405, and a source that is coupled to VSS. Transistor M417A has a gate that is coupled to node N403, a drain that is coupled to node N405 and a source that is coupled to VDD. Current source 141 is coupled between N401 and VSS.

Transistor M425 includes a gate that is coupled to NEG, a drain that is coupled to node N407, and a source that is coupled to node N406. Transistor M426 includes a gate that is coupled to POS, a drain that is coupled to node N408, and a source that is coupled to node N406. Transistor M421 includes a gate and drain that are coupled to node N407, and a source that is coupled to VSS. Transistor M420 includes a gate that is coupled to N407, a drain that is coupled to N409, and a source that is coupled to VSS. Transistor M416B includes a gate and drain that are coupled to node N409, and a source that is coupled to VDD. Transistor M417B includes a gate that is coupled to node N409, a drain that is coupled to node N405, and a source that is coupled to VDD. Transistor M410B includes a gate and drain that are coupled to node N408, and a source that is coupled to VSS. Transistor M413B includes a gate that is coupled to node N408, a drain that is coupled to node N405, and a source that is coupled to VSS. Current source 142 is coupled between N406 and VSS.

The transconductance amplifiers (410, 420) illustrated in FIG. 4 have inputs coupled to POS and NEG and a common output at node N405, which is coupled to the OUT terminal. Transconductance amplifiers 410 and 420 amplify the differential intermediary signal Vint_d (see FIGS. 2 and 3) and provide a single ended output signal (Vout). Transistors M411, M412 and M425, M426 are arranged as differential pairs of transistors that have active load devices M415, M416A and M421, M410B respectively.

Transistor M414 and M415 are arranged as a current mirror, while transistor M410A and M413A are arranged as another current mirror such that M413A is biased to conduct a current that is controlled by NEG relative to node N401. Similarly, transistors M416A and M417A are arranged as a current mirror such that M417A is biased to conduct a current that is controlled by POS relative to node N401. Thus, the combination of M417A and M413A provides an output that is controlled by difference between POS and NEG (or Vint_d). Transconductance amplifier 420 operates substantially similar to transconductance amplifier 410 except for the transistor types being reversed (i.e. the NMOS input pair is replaced by a PMOS input pair, etc.).

Having read the present disclosure, one of ordinary skill in the art may employ another transconductance amplifier that is arranged to operate with the pre-gain stage amplifiers (310, 320) that are illustrated in FIG. 3.

Exemplary Complete Output Buffer

Figure 5:
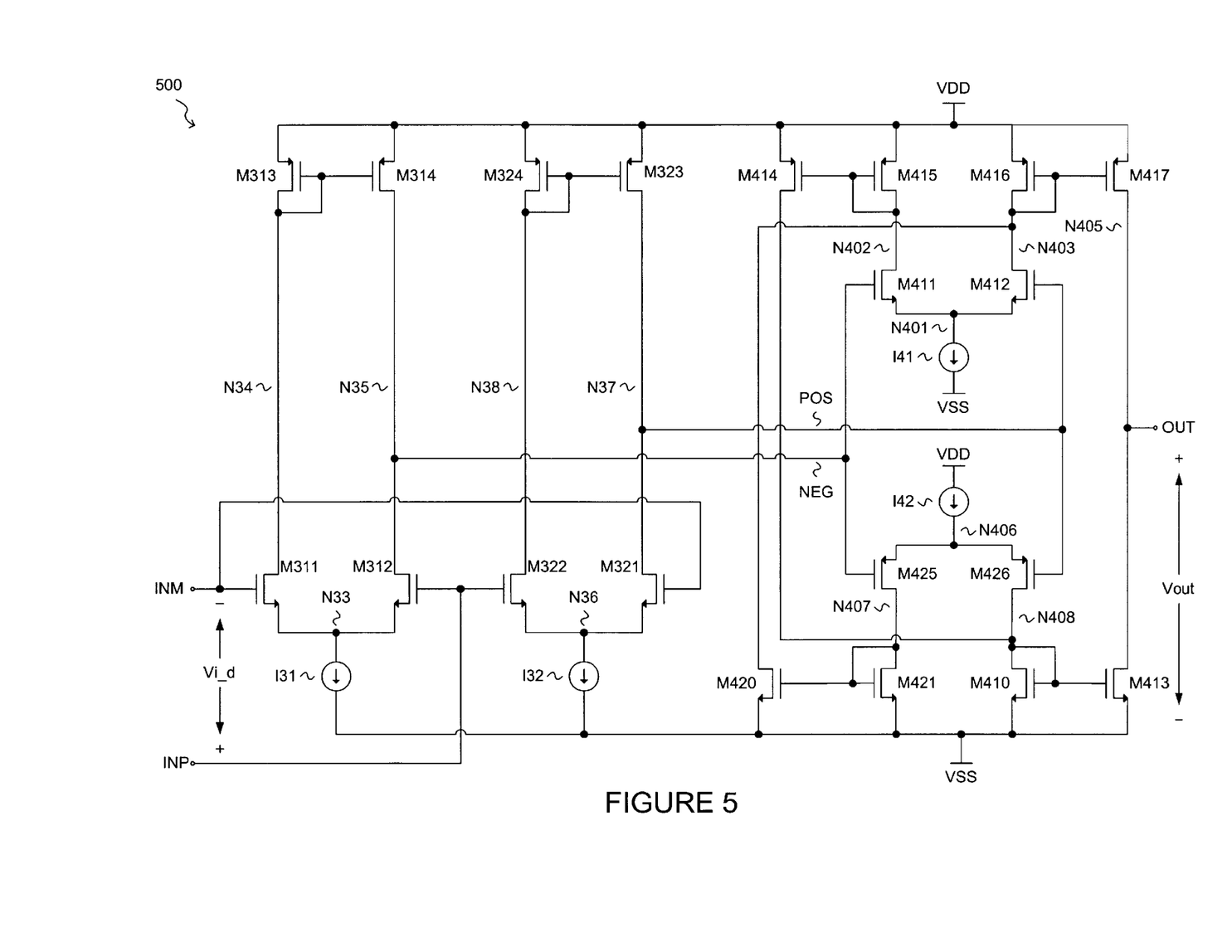
FIG. 5 is a schematic diagram illustrating a complete output buffer, in accordance with the present invention.

An exemplary complete output buffer (500) that includes a pre-gain stage amplifier (300) and a gain stage amplifier (400) is illustrated in FIG. 5, as will be described below. Like components from FIGS. 3 and 4 are labeled identically. In FIG. 5, transistors M416A and M416B from FIG. 4 are combined into a single transistor (M416). Also, transistors M417A and M417B are combined into a single transistor (M417); transistors M410A and M410B are combined into a single transistor (M417); and transistors M413A and M413B are combined into a single transistor (M413). Nodes N403 and N409 from FIG. 4 are shorted together as shown in FIG. 5. Also shown in FIG. 5, nodes N404 and N408 from FIG. 4 are shorted together.

Since there are effectively two input differential pairs in the gain stage (transistors M411, M412, M425, M426), the combination of the transistors into a single transconductance amplifier provides for a high gain amplifier. The arrangement of transistors in the pre-gain stage provide for a differential intermediary signal (Vint_d) between POS and NEG. The differential intermediary signal has a common-mode voltage that is roughly in the middle of the power supplies (VDD, VSS). Since both differential pairs (M411, M412; and M425, M426) will be in their linear operating range when Vint_d is in the middle of the supply range, maximum gain is provided from the gain-stage. Also, transistors M411, M412 and M425, M426 may be sized very small (W on the order of 2.4 um, and L on the order of 0.35 um) so that they do not slow down the speed of the pre-gain stage (minimal loading).

As previously described above, the circuit arrangement depicted in FIG. 5 provides for minimum capacitive loading on the source of the differential input signal (i.e., another electronic circuit that produces a differential output signal). By providing a symmetrical pre-gain stage with matched differential pairs (M311, M312; M321, M322), symmetrical gain is provided without distorting the shape of the amplified differential input signal.

The output buffer (500) illustrated in FIG. 5 is arranged to drive capacitive loads. In this arrangement, an overall gain is achieved of at least 50 dB at 100 Mhz, and at least 30 dB at 1 GHz. These gains are achieved without increasing the load capacitance from the input stage transistors in the pre-gain stage. The gain stage depicted in FIG. 5 has increased gain since there are two differential pairs (of opposite transistor types) connected with paralleled differential inputs.

Although the preceding description describes various embodiments of the system, the invention is not limited to such embodiments, but rather covers all modifications, alternatives, and equivalents that fall within the spirit and scope of the invention. For example, the output buffer described herein may be used in an output buffer for any differential output that is sensitive to capacitive loading including but not limited to a voltage controlled oscillator (VCO) circuit. Also, the present invention has utility in other high-speed applications where bandwidths up to the gigahertz range are possible. Since many embodiments of the invention can be made without departing from the spirit and scope of the invention, the invention resides in the claims hereinafter appended.

We claim:

1. An apparatus for providing a buffered output signal in response to a differential input signal that is provided by an electronic circuit, the apparatus comprising:

a pre-gain stage amplifier that is arranged to provide a differential intermediary signal in response to the differential input signal, wherein the pre-gain stage amplifier includes a first differential amplifier that provides a first half of a gain associated with the pre-gain amplifier and a second differential amplifier that provides a second half of the gain of the pre-gain stage amplifier, wherein the input impedance of the pre-gain stage amplifier has a low input capacitance such that the performance of the electronic circuit is unaffected by the apparatus; and a gain stage amplifier that provides the buffered output signal in response to the differential intermediary signal, the gain stage amplifier further comprising a first n-type transistor and a second n-type transistor that are configured as an n-type differential pair, a first p-type transistor and a second p-type transistor that are configured as a p-type differential pair, wherein the n-type differential pair and the p-type differential pair have common inputs that are coupled to the differential intermediary signal, a first current mirror that includes a first diode-connected p-type transistor that is coupled to the first n-type transistor, a second current mirror that includes a second diode-connected p-type transistor that is coupled to the second n-type transistor, a third current mirror that includes a first diode-connected n-type transistor that is coupled to the first p-type transistor, a fourth current mirror that includes a second diode-connected n-type transistor that is coupled to the second p-type transistor, wherein outputs of the second current mirror and the fourth current mirror are coupled together to provide the buffered output signal.

2. An apparatus as in claim 1, the pre-gain stage amplifier further comprising a first non-inverting input and a first inverting input to the first amplifier, and a second non-inverting input and a second inverting input to the second amplifier, wherein the first non-inverting input is coupled to the second inverting input, the first inverting input is coupled to the second non-inverting input, and the differential input signal is received across the first non-inverting input and the first inverting input such that the first and second amplifiers provide symmetrical gain with respect to the differential input signal and the differential intermediary signal.

3. An apparatus as in claim 2, the first amplifier further comprising a first transistor and a second transistor that are arranged to operate as a differential pair, wherein the first non-inverting input is coupled to the first transistor, and the first inverting input is coupled to the second transistor such that the input capacitance of the first amplifier is determined by the first and second transistors.

4. An apparatus as in claim 3, wherein the first transistor and the second transistor are matched in size and provide minimal capacitive loading on the electronic circuit.

5. An apparatus as in claim 3, further comprising a current mirror that is arranged to operate as an active load for the differential pair.

6. An apparatus as in claim 1, wherein the gain amplifier is a transconductance amplifier that is arranged to provide the buffered output signal to a capacitive load in response to the differential intermediary signal.

7. An apparatus as in claim 1, wherein the pre-gain stage and the gain stage are arranged to provide the buffered output signal with a gain of at least 30 dB when the differential input signal is at a frequency of 1 GHz.

8. An apparatus as in claim 1, wherein the pre-gain stage and the gain stage are arranged to provide the buffered output signal with a duty cycle that is in a range from 48% to 52% when the differential input signal has a duty cycle of 50%.

9. An apparatus for providing a buffered output signal in response to a differential input signal that is provided by an electronic circuit, the apparatus comprising:
a first differential amplifier that includes a first non-inverting input, a first inverting input, and a first output, wherein the differential input signal is coupled across the first non-inverting input and the first inverting input;
a second differential amplifier that includes a second inverting input that is coupled to the first non-inverting input, a second non-inverting input that is coupled to the first inverting input, and a second output, wherein the first differential amplifier and the second differential amplifier are arranged to provide an intermediary differential signal across the first output and the second output;
a first transconductance amplifier that includes a third non-inverting input that is coupled to the first output, and a third inverting input that is coupled to the second output, the first transconductance amplifier including an n-type differential pair that has a common node that is coupled to a first current source, wherein the n-type differential pair is configured to receive the intermediary differential signal; and
a second transconductance amplifier that includes a fourth non-inverting input that is coupled to the first output, and a fourth inverting input that is coupled to the second output, the second transconductance amplifier including a p-type differential pair that has a common node that is coupled to a second current source, wherein the p-type differential pair is configured to receive the intermediary differential signal, and wherein the first and second transconductance amplifiers share a push-pull output stage that is configured to provide the buffered output signal.

10. An apparatus as in claim 9, wherein the first differential amplifier is arranged to provide a first gain to the differential input signal and the second differential amplifier is arranged to provide a second gain to the differential input signal that is matched to the first gain such that the first and second differential amplifiers provide an overall gain that is substantially twice the gain of the first differential amplifier.

11. An apparatus as in claim 9, wherein the first differential amplifier and the second differential amplifier have matched input impedances.

12. An apparatus as in claim 9, wherein the first differential amplifier includes a first differential pair of transistors that are arranged to receive the differential input signal and the second differential amplifier has a second differential pair of transistors that are arranged to receive the differential input signal, such that the differential intermediary signal provides for at least one of common mode noise rejection, power supply variation rejection, and symmetrical signal shape.

13. An apparatus as in claim 12, wherein the apparatus is arranged to provide the buffered output signal with a gain of at least 50 dB with respect to the differential input signal when the differential input signal has a frequency of 100 MHz.

14. An apparatus as in claim 9, wherein the n-type and the p-type differential pairs are biased in their linear operating region by the first and second differential amplifiers.

15. An apparatus for providing a buffered output signal in response to a differential input signal that is provided by an electronic circuit, the apparatus comprising:
a first means for amplifying that is arranged to provide a differential intermediary signal by differentially amplifying the differential input signal such that the differential intermediary signal rejects common-mode signals, wherein the first means for amplifying includes a means for receiving that is arranged to receive the differential input signal while minimizing capacitive loading on the electronic circuit; and
a second means for amplifying that is arranged to provide the buffered output signal by amplifying the differential intermediary signal, the second means for amplifying including a first transconductance means for providing an output current, a second transconductance means for providing another output current, and a means for combining, wherein the means for combining is arranged to combine the output currents of the first and second transconductance means such that the first and second transconductance means provide amplification of the differential intermediary signal.

\* \* \* \* \*